(12) United States Patent
Kaneko

(10) Patent No.: US 7,402,508 B2
(45) Date of Patent: Jul. 22, 2008

(54) BUMP STRUCTURE AND METHOD OF MANUFACTURING THE SAME, AND MOUNTING STRUCTURE FOR IC CHIP AND CIRCUIT BOARD

(75) Inventor: Tsuyoshi Kaneko, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 197 days.

(21) Appl. No.: 10/849,884

(22) Filed: May 21, 2004

(65) Prior Publication Data
US 2005/0006788 A1   Jan. 13, 2005

(30) Foreign Application Priority Data
Jun. 13, 2003  (JP) ............... 2003-169051

(51) Int. Cl.
*H01L 23/48* (2006.01)
*H01L 23/52* (2006.01)
*H01L 29/40* (2006.01)
(52) U.S. Cl. ...................... 438/613; 257/737
(58) Field of Classification Search ............ 257/737, 257/781
See application file for complete search history.

(56) References Cited

U.S. PATENT DOCUMENTS 5,477,087 A * 12/1995 Kawakita et al. ............ 257/737
5,508,228 A    4/1996 Nolan et al.
5,666,270 A *  9/1997 Matsuda et al. ............. 361/704
5,790,377 A *  8/1998 Schreiber et al. ............ 361/704
6,734,029 B2 * 5/2004 Furusawa ..................... 438/22
2002/0151161 A1* 10/2002 Furusawa ................... 438/597
2003/0151650 A1*  8/2003 Masuda et al. ............... 347/96
2004/0203235 A1* 10/2004 Miyakawa .................. 438/689
2005/0058773 A1*  3/2005 Hasei et al. ................. 427/162

FOREIGN PATENT DOCUMENTS

| DE | 101 26 296 A 1 | 12/2002 |
| JP | A3-60036 | 3/1991 |
| JP | A 5-6893 | 1/1993 |
| JP | A 5-47768 | 2/1993 |
| JP | A 09-512386 | 12/1997 |
| JP | A 2002-164386 | 6/2002 |

* cited by examiner

*Primary Examiner*—Evan Pert
*Assistant Examiner*—Benjamin P. Sandvik
(74) *Attorney, Agent, or Firm*—Oliff & Berridge, PLC

(57) ABSTRACT

The invention provides a bump structure whose mounting position, shape, and size are favorably controlled and to a method of manufacturing the same. The bump structure of the invention can be provided on an insulating layer and includes a protruding part made of resin obtained by hardening a liquid material and a conductive layer that covers the protruding part. The protruding part can be obtained by forming a liquid-repelling part with a liquid-repelling characteristic for the liquid material and a liquid-attracting part that is more wettable than the liquid-repelling part for the liquid material on an upper surface on the insulating layer, discharging the liquid material onto the liquid-attracting part, and then hardening the liquid material.

4 Claims, 9 Drawing Sheets

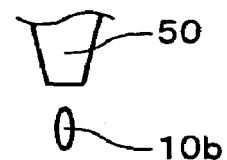
Fig. 4a
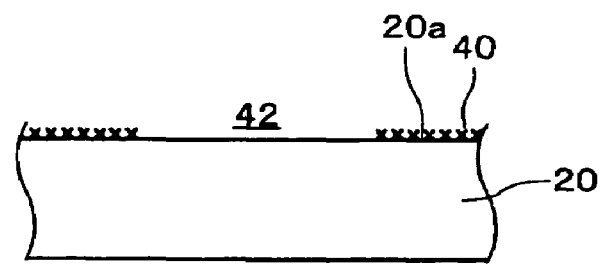
Fig. 4b
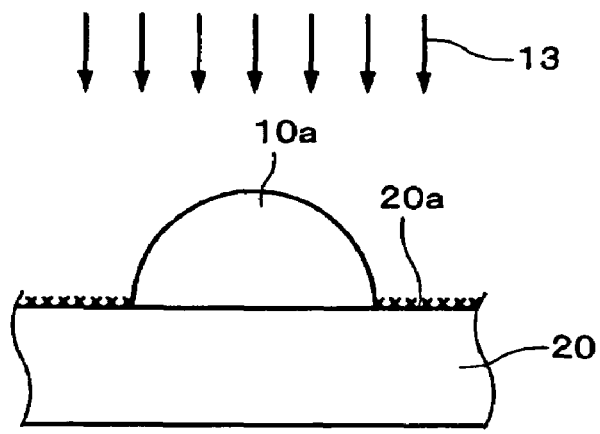
Fig. 4c
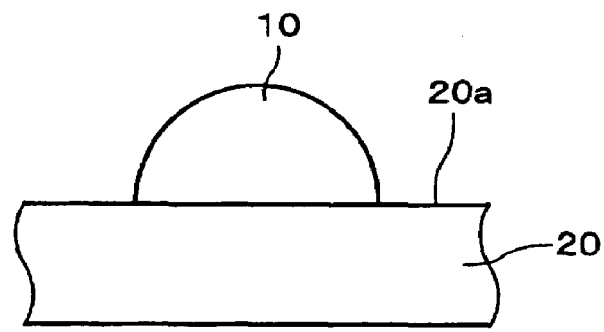

US 7,402,508 B2

BUMP STRUCTURE AND METHOD OF MANUFACTURING THE SAME, AND MOUNTING STRUCTURE FOR IC CHIP AND CIRCUIT BOARD

RELATED APPLICATIONS

The present application claims priority to Japanese Patent Application No. 2003-169051 filed Jun. 13, 2003, which is hereby expressly incorporated by reference herein in its entirety.

BACKGROUND OF THE INVENTION

1. Field of Invention

The present invention relates to a bump structure whose mounting position, shape, and size can be favorably controlled and to a method of manufacturing the same.

2. Description of Related Art

When an element is directly mounted onto a board using flip-chip bonding, in many cases, such mounting is carried out via bumps made of metal (metal bumps) formed on the element or on the electrodes of the board. As one example, these metal bumps can be formed by fusing metal wires and then breaking off the wires. See, for example, Japanese Unexamined Patent Publication No. H05-6893. Alternatively, these metal bumps can be formed by plating. See, for example, Japanese Unexamined Patent Publication No. H05-6893 and Japanese Unexamined Patent Publication No. H05-47768. However, such methods for forming metal bumps require complex processes and/or apparatuses. Also, it is difficult to control the shapes and sizes of the obtained metal bumps, as well as the formation positions of the metal bumps, with high precision.

On the other hand, a method that discharges conductive paste using an ink jet method is known as a simpler method for forming metal bumps. See, for example, Japanese Unexamined Patent Publication No. H03-60036. However, since the viscosity of conductive paste is normally extremely high, when this method of forming is used, it is difficult to precisely discharge the conductive paste from the nozzle of an ink jet head. This means that in the same way as the methods of forming described above, it is difficult to control the shapes and sizes of the formed metal bumps, as well as the formation positions of the metal bumps, with high precision.

SUMMARY OF THE INVENTION

It is an object of the invention to provide a bump structure whose mounting position, shape, and size can be favorably controlled and to a method of manufacturing the same.

A bump structure according to the invention can include a protruding part provided on an insulating layer and composed of resin obtained by hardening a liquid material, and a conductive layer that covers the protruding part. The protruding part can be obtained by forming a liquid-repelling part with a liquid-repelling characteristic for the liquid material and a liquid-attracting part that is more wettable than the liquid-repelling part for the liquid material on an upper surface of the insulating layer, and then discharging the liquid material onto the liquid-attracting part and hardening the liquid material.

A bump structure according to the invention can include a recessed part provided in a substrate, a protruding part that is partially buried in the recessed part, and a conductive layer that covers the protruding part. A top part of the protruding part is at a higher position than a highest part of the recessed part.

A bump structure according to the invention can include a protrusion provided on a substrate, a protruding part that is provided on an upper surface of the protrusion, and a conductive layer that covers the protruding part.

With the bump structure above, by having the described composition, it is possible to obtain a bump structure whose mounting position, shape, and size can be favorably controlled. This is described in greater detail below.

The bump structures of the invention described above can have the following aspects. In the bump structure described above, it is possible to make the maximum width $d_1$ of a cross-section of the protruding part larger than the maximum width $d_2$ of the upper surface of the protrusion. It should be noted that in the case where the cross-section of the protruding part is circular, for example, the maximum width of a cross-section of the protruding part is the maximum diameter of a (circular) cross-section of the protruding part, while as another example, in the case where the cross-section of the protruding part is oval, the maximum width of a cross-section of the protruding part is the maximum diameter of an (oval) cross-section of the protruding part. This also applies to the maximum width of the upper surface of the protrusion. It should be noted that the expression a cross-section of the protruding part refers to a cross-section obtained by cutting the protruding part on a plain parallel to an upper surface of the protrusion.

In the bump structures described above, it is possible for the substrate to be composed of an insulating layer. Further, in the bump structures described above, it is possible for the conductive layer to be electrically coupled to an electrode connecting part.

A method of manufacturing a bump structure can include the steps of forming a liquid-repelling part with a liquid-repelling characteristic for droplets and a liquid-attracting part that is more wettable than the liquid-repelling part for the droplets on an upper surface of an insulating layer, discharging the droplets onto the liquid-attracting part to form a protruding part precursor, hardening the protruding part precursor by applying energy to form a protruding part, and forming a conductive layer so as to cover the protruding part.

A method of manufacturing a bump structure can include the steps of forming a recessed part in a substrate, discharging droplets onto a base surface of the recessed part to form a protruding part precursor, applying energy to the protruding part precursor to harden the protruding part precursor and form a protruding part that is partially buried in the recessed part, with a top part of the protruding part being set at a higher position than a highest part of the recessed part, and forming a conductive layer so as to cover the protruding part.

A method of manufacturing a bump structure can include the steps of forming a protrusion on a substrate, discharging droplets onto an upper surface of the protrusion to form a protruding part precursor, applying energy to the protruding part precursor to harden the protruding part precursor and form a protruding part, and forming a conductive layer so as to cover the protruding part.

According to the methods of manufacturing a bump structure described above, by adjusting the discharged amount of droplets, it is possible to form bump structures whose mounting position, shape, and size have been favorably controlled using a simpler method. This is described in greater detail below.

The methods of manufacturing a bump structure of the invention described above can have the following aspects. The method of manufacturing a bump structure described above may form a maximum width $d_1$ of a cross-section of the protruding part larger than a maximum width $d_2$ of the upper surface of the protrusion. The method of manufacturing a bump structure described above may compose the substrate of an insulating layer. The method of manufacturing a bump structure described above may carry out, before the protruding part precursor is formed, a liquid-repelling treatment on a region aside from a region in which the protruding part precursor is formed.

The method of manufacturing a bump structure described above may discharge the droplets according to an ink jet method. Here, the expression ink jet method refers to a method that discharges droplets using an ink jet head. However, in this case, the droplets that are discharged are not ink that is used on printed materials but a liquid including raw materials for the protruding part. According to this method, it is possible to finely adjust the discharged amount of the droplets, so that a minute protruding part can be mounted easily. For the method of manufacturing a bump structure described above, the droplets may include a precursor of either thermosetting resin or UV-hardening resin, and the energy may be heat or UV rays.

In a mounting structure of an IC chip and a circuit board according to the invention, the IC chip and the circuit board can be joined via the above bump structure, and the bump structure is formed on a surface of either the IC chip or the circuit board.

BRIEF DESCRIPTION OF THE DRAWINGS

The invention will be described with reference to the accompanying drawings, wherein like numerals reference like elements, and wherein;

FIG. 4(a) to FIG. 4(c) are cross-sectional views respectively and schematically showing manufacturing processes for the bump structure shown in FIG. 1 and FIG. 2;

DETAILED DESCRIPTION OF PREFERRED EMBODIMENTS

Preferred embodiments of the present invention will now be described with reference to the drawings.

Figure 1:
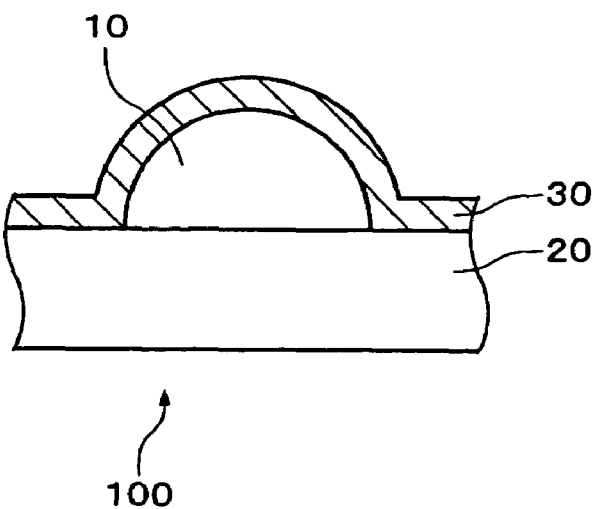
FIG. 1 is a cross-sectional view that schematically shows a bump structure according to the first embodiment.
Figure 2:
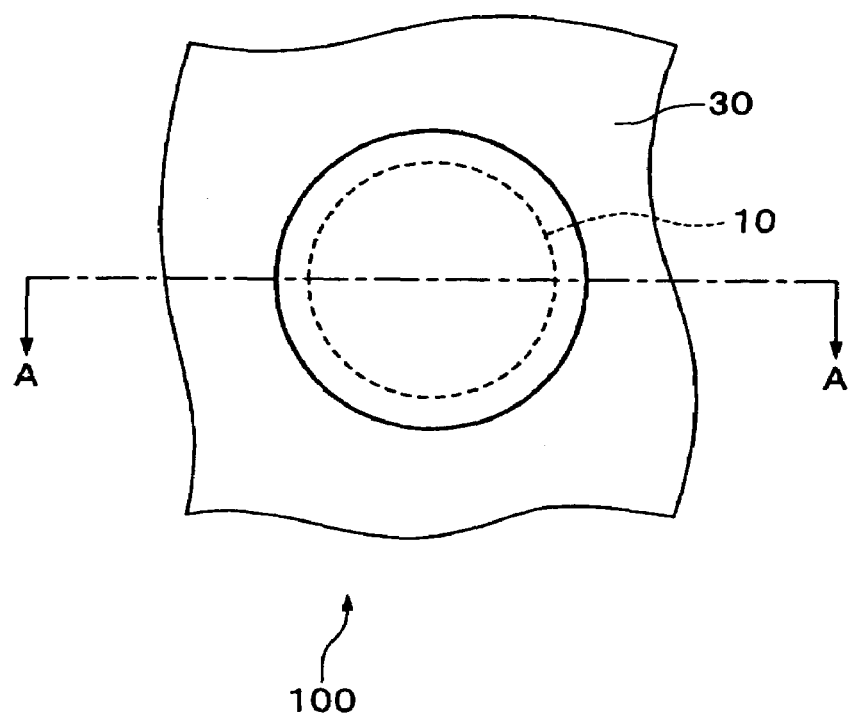
FIG. 2 is a plan view schematically showing the bump structure shown in FIG. 1.

FIG. 1 is a cross-sectional view schematically showing a bump structure 100 according to an embodiment of the present invention. FIG. 2 is a plan view schematically showing the bump structure 100 shown in FIG. 1. It should be noted that FIG. 1 shows a cross-section taken along a line A—A in FIG. 2.

The bump structure 100 according to the embodiment includes a protruding part 10 made of resin and a conductive layer 30 that covers the protruding part 10. The protruding part 10 is provided on an insulating layer 20 and is obtained by hardening a liquid material. More specifically, the protruding part 10 is made, for example, of resin obtained by hardening a liquid material that can be hardened through the application of energy, such as heat or light. Even more specifically, in the embodiment, the protruding part 10 is formed by forming a liquid-repelling part 40 that repels the liquid material mentioned above and a liquid-attracting part 42 that is more wettable for the liquid material mentioned above than the liquid-repelling part 40 on an upper surface 20a of the insulating layer 20, then discharging droplets of the liquid material mentioned above onto the liquid-attracting part 42 to form a protruding part precursor 10a (described later) on the liquid-attracting part 42, and after this hardening the protruding part precursor 10a. It should be noted that the liquid-repelling part 40 and the liquid-attracting part 42 are described below in the Method of Manufacturing section (see FIG. 3(a) to FIG. 4(c)).

Percursors of UV-hardening resin and thermosetting resin can be given as examples of the liquid material mentioned above. Acrylic and epoxy UV hardening resins can be given as examples of UV hardening resins. Polyimide thermosetting resin can be given as an example of a thermosetting resin. Out of these, when the protruding part 10 is formed using a thermosetting resin, a bump structure 100 with superior heat resistance can be obtained. In particular, when a board including the bump structure 100 is mounted, the bump structure 100 is exposed to high temperature conditions of around 400° C., for example, during the mounting process, so that it is preferable for the bump structure 100 to have superior heat resistance. Also, when the protruding part 10 is formed using a UV-hardening resin, a heating process is not required during hardening, which is favorable in that little damage is caused for parts (such as an element) aside from the bump structure 100.

The protruding part 10 in the bump structure 100 is hemispherical. In this case, the curvature and radius of the protruding part 10 can be appropriately set by adjusting the amount of the liquid material mentioned above.

The insulating layer 20 may be an inorganic material, such as silicon oxide, silicon nitride, oxide nitride silicon, or the like, or an organic material, such as resin. When the insulating layer 20 is made of resin, the insulating layer 20 can be formed using polyimide resin, acrylic resin, epoxy resin, and a fluororesin, for example.

The conductive layer 30 is formed on the protruding part 10. More specifically, as shown in FIG. 1, the conductive layer 30 can be formed so as to cover the protruding part 10. There are no particular limitations on the material of the conductive layer 30, and a multilayer structure of two or more layers may be used. As examples, a metal, such as aluminum, copper, silver, gold, platinum, zinc, tin, nickel, titanium, tungsten, germanium, or cobalt, an alloy of these metals, or a transparent electrode, such as ITO, can be used as the conductive layer 30.

Figure 3A:
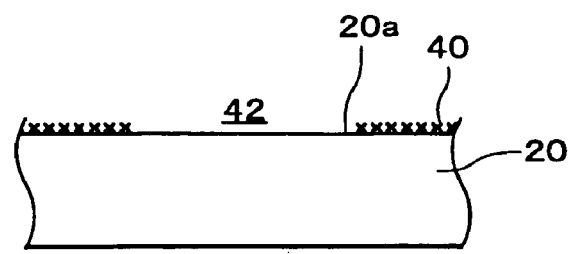
FIG. 3(a) is a cross-sectional view schematically showing a manufacturing process of the bump structure shown in FIG. 1 and FIG. 2.
Figure 3B:
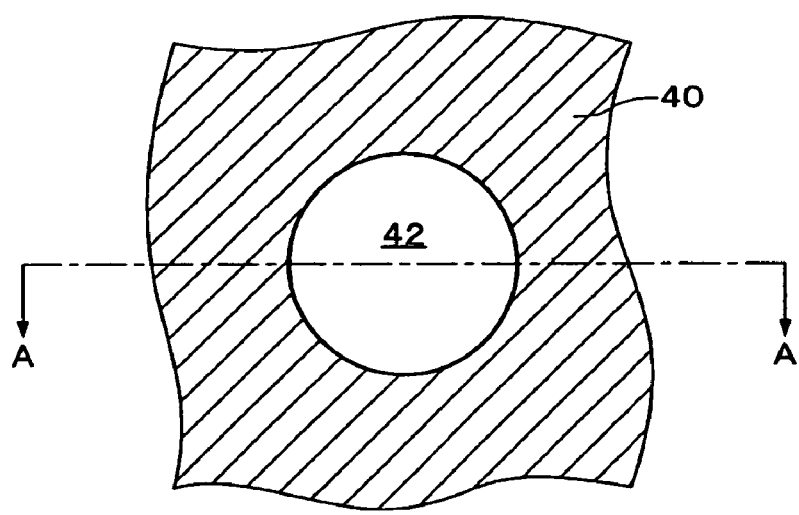
FIG. 3(b) is a plan view schematically showing the manufacturing process shown in FIG. 3(a)

Next, a method of manufacturing the bump structure 100 shown in FIG. 1 and FIG. 2 will be described with reference to FIG. 3(a) to FIG. 4(c). FIG. 3(a) and FIG. 4(a) to FIG. 4(c) are cross-sectional views respectively showing manufacturing processes of the bump structure 100 shown in FIG. 1 and FIG. 2. FIG. 3(b) is a plan view schematically showing the manufacturing process shown in FIG. 3(a). FIG. 3(a) shows a cross-section taken along a line A—A in FIG. 3(b).

First, by carrying out a liquid-repelling treatment on a predetermined region of the upper surface 20a of the insulating layer 20, the liquid-repelling part 40 is formed (see FIG. 3(a) and FIG. 3(b)). This liquid-repelling treatment can control the wettability of the upper surface 20a of the insulating layer 20 with respect to the liquid material (used in a later process) for forming the protruding part 10. By doing so, it is possible to control the mounting position of the protruding part 10. More specifically, this liquid-repelling treatment may be carried out for a region aside from the region in which the protruding part 10 will be formed in a later process, or this liquid-repelling treatment may be carried out for the entire upper surface 20a of the insulating layer 20, with the liquid-repelling part 40 then being removed from only the region in which the protruding part 10 will be formed. By the above process, the liquid-repelling part 40 is formed. It should be noted that the region shown by the crosses "x" in FIG. 3(a) and the diagonally shaded region in FIG. 3(b) are both the liquid-repelling part 40. The region of the upper surface 20a of the insulating layer 20 where the liquid-repelling part 40 is not formed is the liquid-attracting part 42. This liquid-attracting part 42 is a region with higher wettability for the liquid material mentioned above than the liquid-repelling part 40.

This liquid-repelling part 40 has a low wettability for the liquid material for forming the protruding part 10. The liquid-repelling part 40 can be formed by carrying out a plasma treatment on the upper surface 20a of the insulating layer 20, for example. Alternatively, the liquid-repelling part 40 can be formed of a film (for example, a monomolecular film of alkylsilane fluoride) with a liquid-attracting characteristic for the liquid material mentioned above.

In addition, by carrying out a liquid-attracting treatment on only the liquid-attracting part 42 in FIG. 3(a) and FIG. 3(b), it is possible to increase the wettability for the liquid material for forming the protruding part 10.

There are also no particular limitations on the method of forming the insulating layer 20. When the material of the insulating layer 20 is resin, the insulating layer 20 can be formed using a method, such as spin coating, dipping, and an ink jet method. When the material of the insulating layer 20 is a silicon oxide layer, a silicon nitride layer, or an oxide nitride silicon layer, the insulating layer 20 can be formed as a layer by CVD, for example.

Next, the protruding part 10 is formed on the upper surface 20a of the insulating layer 20 (see FIG. 4(a) to FIG. 4(c)).

First, droplets 10b of the liquid material for forming the protruding part 10 are discharged on the liquid-attracting part 42, out of the upper surface 20a of the insulating layer 20, to form the protruding part precursor 10a (see FIG. 4(a) and FIG. 4(b)). As described above, the liquid material is capable of being hardened through the application of energy 13.

A dispenser method and an ink jet method are examples of methods of discharging the droplets 10b. The dispenser method is a common method for discharging droplets, and is effective when discharging the droplets 10b onto a relatively wide region. The ink jet method is a method where droplets are discharged using an ink jet head, where it is possible to control the discharge position of the droplets in units in the order of im. In addition, the amount of the discharged droplets can be control in units in the order of picoliters. In this way, by discharging droplets in the present process using the ink jet method, it is possible to strictly control the size of the protruding part 10. In FIG. 4(a), a process that discharges the droplets 10b onto the liquid-attracting part 42 from a nozzle 50 of an ink jet head is shown.

The protruding part precursor 10a is formed on the liquid-attracting part 42. Even if the droplets 10b make impact with the liquid-repelling part 40, the wettability of the liquid-repelling part 40 for the droplets 10b is lower than the wettability of the liquid-attracting part 42 for the droplets 10b, so that the droplets 10b that have made impact with the liquid-repelling part 40 move to the liquid-attracting part 42. In this way, by providing the liquid-repelling part 40 on the upper surface 20a of the insulating layer 20, it is possible to control the formation position of the protruding part precursor 10a. Also, the size of the protruding part precursor 10a can be controlled by adjusting the discharged amount of the droplets 10b.

Next, the protruding part precursor 10a is hardened to form the protruding part 10 (see FIG. 4(c)). More specifically, the energy 13, such as heat or light, is applied to the protruding part precursor 10a. When hardening the protruding part precursor 10a, an appropriate method for the type of liquid material is used. As examples, heat energy is applied, or irradiation with light, such as UV rays or laser light is carried out.

Next, the conductive layer 30 is formed on the protruding part 10 so as to cover the protruding part 10 (see FIG. 1 and FIG. 2). The method of forming the conductive layer 30 can be selected as appropriate in accordance with the material, etc., of the conductive layer 30. For example, it is possible to form the conductive layer 30 using vapor deposition or sputtering. Also, as necessary, it is possible to form the conductive layer 30 in a predetermined pattern by patterning the conductive layer 30 using a method such as a lift-off method, dry etching, or wet etching.

By carrying out the above process, the bump structure 100 of the embodiment is obtained (see FIG. 1 and FIG. 2).

The bump structure and the method of manufacturing according to the embodiment have the following operation and effects.

First, compared to a normal method of manufacturing metal bumps, the bump structure 100 according to the embodiment can be manufactured using a simple method. That is, as described above, bumps are normally formed by breaking off wires, by plating, or the like. On the other hand, the bump structure 100 according to the embodiment is mainly composed by a process that forms the liquid-repelling part 40 and the liquid-attracting part 42 on the upper surface 20a of the insulating layer 20, a process that forms the protruding part 10 on the liquid-attracting part 42, and a process that forms the conductive layer 30 that covers the protruding part 10. That is, the protruding part 10 can be formed using the ink jet method described above, for example, and the conductive layer 30 can be formed using a known film forming method described above. Accordingly, no special apparatus is required to manufacture the bump structure 100, so that the bump structure 100 can be formed by a simple method.

Secondly, it is possible to obtain the bump structure 100 that has the desired shape and size and whose mounting position is strictly controlled. As described above, the protruding part 10 of the bump structure 100 is formed by forming the protruding part precursor 10a on the liquid-attracting part 42 and then hardening the protruding part precursor 10a (see FIG. 4(a) and FIG. 4(b)).

Here, it is possible to control the shape and size of the protruding part 10 via the discharged amount of the droplets 10b, so that it is possible to obtain a bump structure 100 of the desired shape and size. Also, by forming the protruding part precursor 10a by discharging the liquid material onto the liquid-attracting part 42 in a state where the liquid-repelling part 40 and the liquid-attracting part 42 have been provided on the upper surface 20a of the insulating layer 20, it is possible to form the protruding part 10 at a desired position.

In particular, when an IC chip, on which a light element such as a light-emitting element or a light-receiving element is mounted, and a circuit board (for example, a glass epoxy substrate or a glass substrate including a wiring layer on a surface thereof) are mounted via a plurality of the bump structures 100, in order to efficiently use the light emitted from the light element, or to efficiently guide light to the light element, it is necessary to join the IC chip and the circuit board in parallel. This means it is necessary to make the heights of the plurality of bump structures 100 for joining the IC chip and the circuit board uniform.

In this case, with the method of manufacturing according to the embodiment, by making the areas of the liquid-attracting parts 42 uniform and strictly controlling the amount of the droplets 10b discharged by the ink jet method when forming the protruding part precursors 10a on the liquid-attracting parts 42, it is possible to make the heights of the protruding parts 10 in the respective bump structures 100 uniform. By doing so, it is possible to make the heights of the plurality of bump structures 100 uniform, so that when the IC chip and the circuit board are mounted via a plurality of the bump structures 100, it is possible to make the distance between the IC chip and the circuit board uniform. As a result, it is possible to efficiently use the light emitted from the light element or to efficiently guide light to the light element.

In this case, when the protruding part precursors 10a are formed by discharging the droplets using the ink jet method, it is possible to form many protruding part precursors 10a at the same time. By doing so, it is possible to efficiently form the bump structures 100, so that the manufacturing cost can be reduced.

Figure 5:
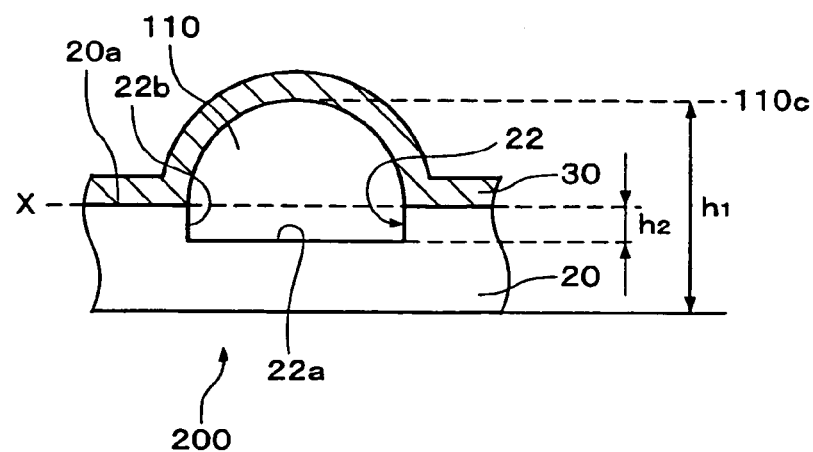
FIG. 5 is a cross-sectional view that schematically shows a bump structure according to the second embodiment.
Figure 6:
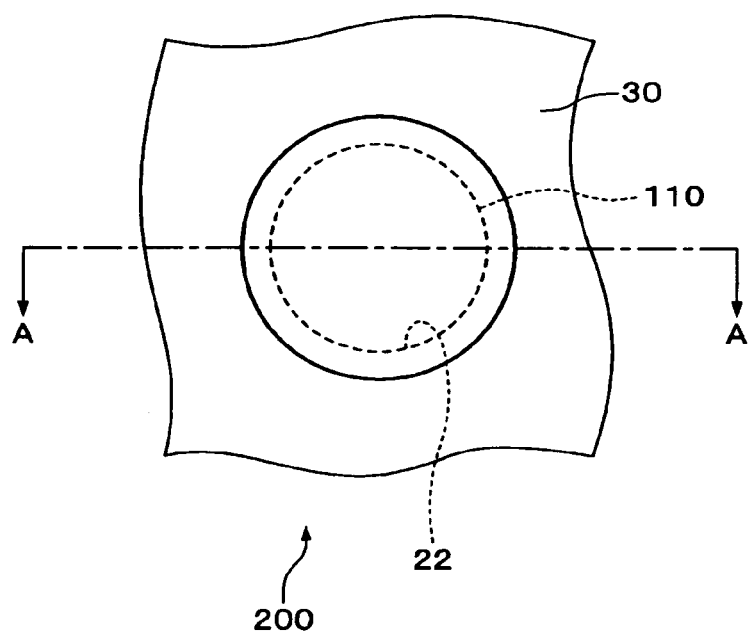
FIG. 6 is a plan view schematically showing the bump structure shown in FIG. 5.

FIG. 5 is a cross-sectional view schematically showing a bump structure 200 according to another embodiment of the invention. FIG. 6 is a plan view schematically showing the bump structure 200 shown in FIG. 5. It should be noted that FIG. 5 shows a cross-section taken along a line A—A in FIG. 6.

The construction of the bump structure 200 according to the embodiment differs to that of the bump structure 100 (see FIG. 1 and FIG. 2) according to the first embodiment in that part of a protruding part 110 is buried inside a recessed part 22 provided in the substrate (the insulating layer 20). That is, in the bump structure 200, the recessed part 22 is provided in the insulating layer 20. The other component elements have the same constructions as in the bump structure 100 according to the first embodiment. Accordingly, in the bump structure 200 according to the embodiment, component elements that are the same as in the bump structure 100 have been assigned the same reference numerals as the component elements of the first embodiment and detailed description thereof has been omitted.

The bump structure 200 according to the embodiment includes the recessed part 22 that is provided in a substrate (the insulating layer 20), the protruding part 110 that is partially buried in the recessed part 22 and the conductive layer 30 that is provided on the protruding part 110.

In the bump structure 200 according to the embodiment, an example where the substrate is the insulating layer 20 is shown, although the material of the substrate is not limited to this, and the substrate may be made of other materials (for example, a conductive layer such as a metal, or a semiconductor substrate such as a silicon substrate or a compound semiconductor substrate). This is also the case for the bump structures of the third to fifth embodiments described in greater detail below.

The recessed part 22 is composed of a base surface 22a and a side wall 22b. The protruding part 110 is provided on the base surface 22a of the recessed part 22. A top part 110c of the protruding part 110 is at a higher position than a highest part of the recessed part 22. In the embodiment, the highest part of the recessed part 22 is the join between the side wall 22b of the recessed part 22 and the upper surface 20a of the insulating layer 20. In FIG. 5, a plane including the upper surface 20a of the insulating layer 20 is shown as the plane "X". The above means that the top part 110c of the protruding part 110 is at a higher position than the plane X. In other words, a height $h_1$ of the protruding part 110 is greater than a depth $h_2$ of the recessed part 22 (see FIG. 5).

In the bump structure 200 according to the present embodiment, the case is shown where the base surface 22a of the recessed part 22 is generally circular, but it should be understood that the shape of the base surface 22a of the recessed part 22 is not limited to this, and may be a variety of shapes, such as an oval or a rectangle. By selecting the shape of the base surface of the recessed part as appropriate, it is possible to control the shape of the protruding part 110.

Next, a method of manufacturing the bump structure 200 shown in FIG. 5 and FIG. 6 will be described with reference to FIG. 7(a) to FIG. 7(d). FIG. 7(a) to 7(d) are cross-sectional views respectively showing manufacturing processes of the bump structure 200 shown in FIG. 5 and FIG. 6.

Figure 7A:
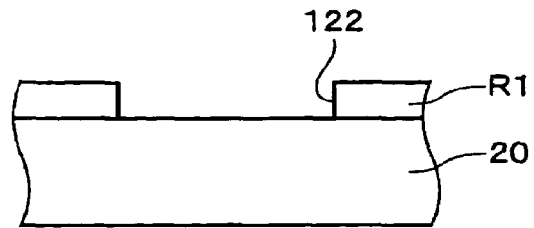
FIG. 7(a) to FIG. 7(d) are cross-sectional views respectively and schematically showing manufacturing processes for the bump structure shown in FIG. 5 and FIG. 6.
Figure 7B:
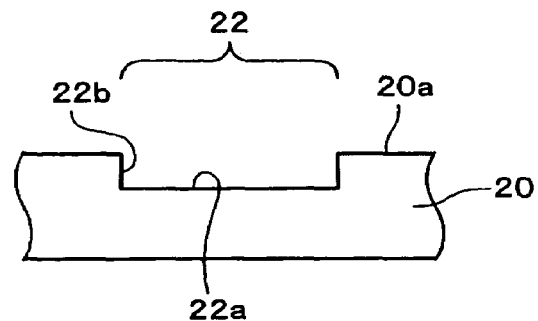

First the recessed part 22 is formed in the substrate (the insulating layer 20) (see FIG. 7(a) and FIG. 7(b)). More specifically, normal photolithography is used to form a resist layer R1 with a predetermined pattern on the insulating layer 20 (see FIG. 7(a)). This resist layer R1 includes an opening 122 in a region in which the recessed part 22 will be formed by a later process. Next, by patterning the substrate (the insulating layer 20) with the resist layer R1 as a mask, the recessed part 22 including the base surface 22a and the side wall 22b is formed (see FIG. 7(b)). Next, the resist layer R1 is removed.

It should be noted that when the substrate is patterned, it is possible to select an appropriate method for the material and type of the substrate (for example, selective growth, dry etching, wet etching, and a lift-off method).

Figure 7C:
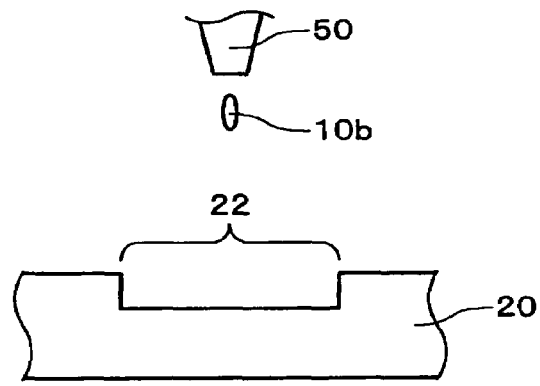
Figure 7D:
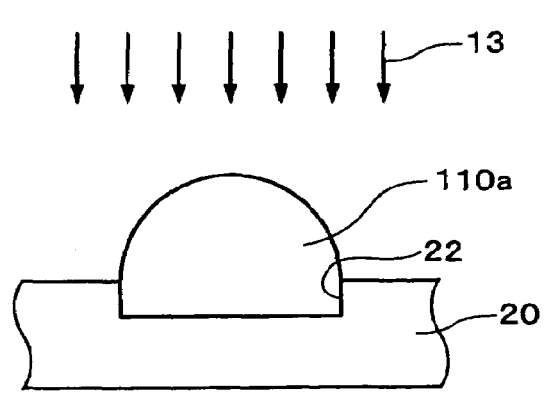

Next, the droplets 10b are discharged onto the base surface 22a of the recessed part 22 to form a protruding part precursor 110a, which is then hardened to form the protruding part 110 (see FIG. 7(c) and FIG. 7(d)), and after this the conductive layer 30 is formed (see FIGS. 5 and 6). The method for forming the protruding part 110 and the conductive layer 30 is the same as for the protruding part 10 and the conductive layer 30 of the first embodiment. It should be noted that before the protruding part precursor 110a is discharged, a liquid-repelling treatment may be carried out on a region of the upper surface 20a of the insulating layer 20 aside from the region in which the protruding part precursor 110a is formed (i.e., a region of the upper surface 20a of the insulating layer 20 aside from the recessed part 22).

By carrying out the above process, the bump structure 200 of the embodiment can be obtained (see FIG. 5 and FIG. 6).

The bump structure 200 according to the embodiment and the method of manufacturing the same have the same operation and effects as the bump structure 100 according to the first embodiment and the method of manufacturing the same. In addition, the bump structure 200 according to the present embodiment and the method of manufacturing the same have the following operation and effects.

First, by appropriately setting the shape and size of the base surface 22a of the recessed part 22, it is possible to appropriately set the shape and size of the protruding part 110. By doing so, it is possible to appropriately set the shape and size of the bump structure 200.

Secondly, part of the protruding part 110 is buried in the recessed part 22. As described above, this protruding part 110 is formed by discharging a liquid material, which can be hardened by applying energy, on the recessed part 22 and hardening the liquid material. That is, by providing the recessed part 22 in a predetermined position, it is possible to control the mounting position of the protruding part 110. As a result, it is possible to obtain a bump structure 200 whose mounting position has been controlled more strictly.

Figure 8:
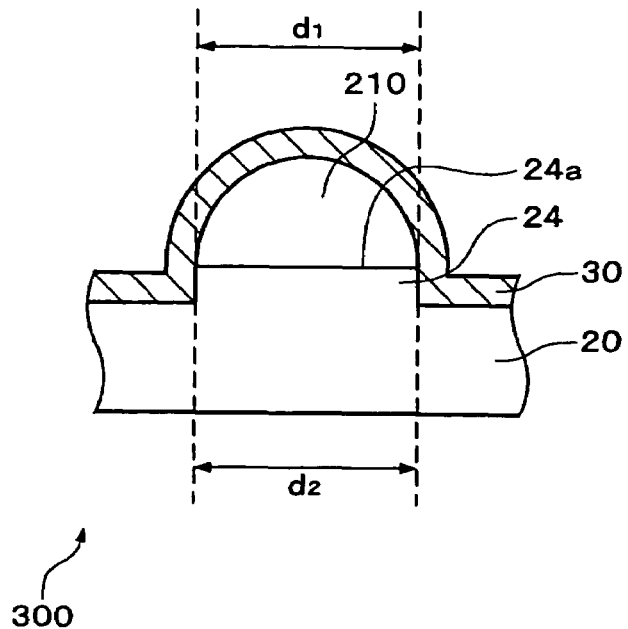
FIG. 8 is a cross-sectional view that schematically shows a bump structure according to the third embodiment.
Figure 9:
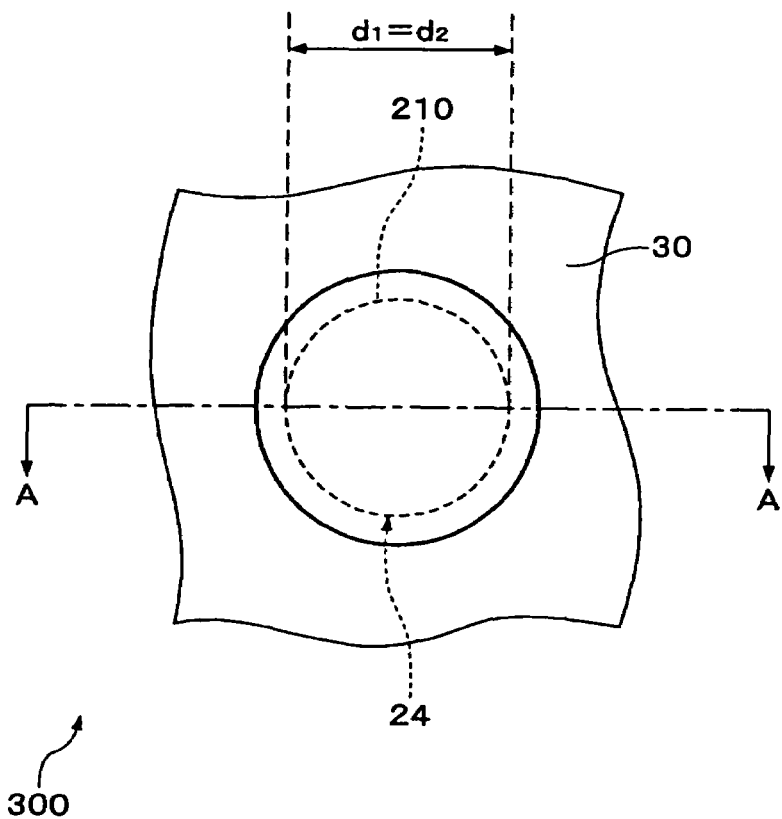
FIG. 9 is a plan view schematically showing the bump structure shown in FIG. 8.

FIG. 8 is a cross-sectional view schematically showing a bump structure 300 according to another embodiment of the present invention. FIG. 9 is a plan view schematically showing the bump structure 300 shown in FIG. 8. It should be noted that FIG. 8 shows a cross-section taken along a line A—A in FIG. 9.

The construction of the bump structure 300 according to the embodiment differs to that of the bump structure 100 (see FIG. 1 and FIG. 2) of the first embodiment in that a protruding part 210 is formed on an upper surface 24a of a protrusion 24 provided on the substrate (the insulating layer 20). That is, in the bump structure 300, the protrusion 24 is provided on the insulating layer 20. The other component elements have the same constructions as in the bump structure 100 of the first embodiment. Accordingly, in the bump structure 300 according to the present embodiment, component elements that are the same as in the bump structure 100 have been assigned the same reference numerals as the component elements of the first embodiment and detailed description thereof has been omitted.

The bump structure 300 according to the embodiment can include the protrusion 24 provided on the substrate (the insulating layer 20), the protruding part 210 that is provided on the upper surface 24a of the protrusion 24, and the conductive layer 30 provided on the protruding part 210.

In the bump structure 300 of the embodiment, the case where the upper surface 24a of the protrusion 24 is circular is shown, but it should be understood that the shape of the upper surface 24a of the protrusion 24 is not limited to this and may be a variety of shapes, such as an oval or a rectangle. By selecting the shape of the upper surface 24a of the protrusion 24 as appropriate, it is possible to control the shape of the protruding part 210.

Next, a method of manufacturing the bump structure 300 shown in FIG. 8 and FIG. 9 will be described with reference to FIG. 10(a) to FIG. 10(d). FIG. 10(a) to 10(d) are cross-sectional views respectively showing manufacturing processes of the bump structure 300 shown in FIG. 8 and FIG. 9.

Figure 10A:
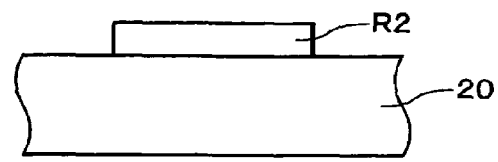
FIG. 10(a) to FIG. 10(d) are cross-sectional views respectively and schematically showing manufacturing processes for the bump structure shown in FIG. 8 and FIG. 9.
Figure 10B:
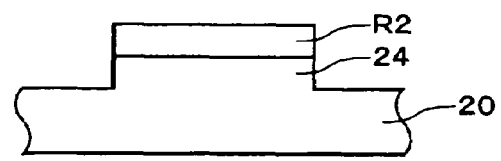

First, the protrusion 24 is formed on the substrate (the insulating layer 20) (see FIG. 10(a) and FIG. 10(b)). More specifically, common photolithography is used to form a resist layer R2 with a predetermined pattern on the insulating layer 20 (see FIG. 10(a)). This resist layer R2 is formed on at least a region in which the protrusion 24 is formed in a later process. Next, by patterning the substrate (the insulating layer 20) with the resist layer R2 as a mask, the protrusion 24 is formed (see FIG. 10(b)). It should be noted that as the basic method of patterning, it is possible to use the method described in the process for forming the recessed part 22 in the second embodiment described above. Next, the resist layer R2 is removed.

Figure 10C:
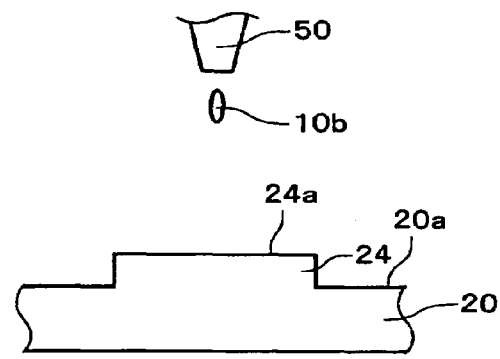
Figure 10D:
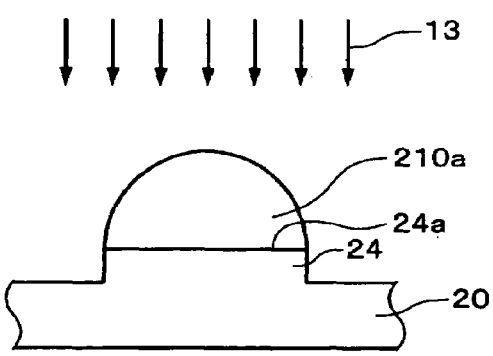

Next, the droplets 10b are discharged onto the upper surface 24a of the protrusion 24 to form a protruding part precursor 210a, which is then hardened to form the protruding part 210 (see FIG. 10(c) and FIG. 10(d)), and after this the conductive layer 30 is formed (see FIG. 8 and FIG. 9). The method for forming the protruding part 210 and the conductive layer 30 is the same as for the protruding part 10 and the conductive layer 30 of the first embodiment. It should be noted that before the protruding part precursor 210a is discharged, a liquid-repelling treatment may be carried out on a region of the upper surface 20a of the insulating layer 20 aside from the region in which the protruding part precursor 210a is formed (i.e., a region of the upper surface 20a of the insulating layer 20 aside from the upper surface 24a of the protrusion 24).

By carrying out the above process, it is possible to obtain the bump structure 300 of the embodiment (see FIG. 8 and FIG. 9).

The bump structure 300 according to the embodiment and the method of manufacturing the same have the same operation and effects as the bump structure 100 according to the first embodiment and the method of manufacturing the same. In addition, the bump structure 300 according to the embodiment and the method of manufacturing the same have the following operation and effects.

First, by appropriately setting the shape and size of the upper surface 24a of the protrusion 24, it is possible to appropriately set the shape and size of the protruding part 210. By doing so, it is possible to appropriately set the shape and size of the bump structure 300.

Secondly, as described above, this protruding part 210 is formed by discharging a liquid material, which can be hardened by applying energy, on the upper surface 24a of the protrusion 24 and hardening the liquid material. That is, by providing the protrusion 24 in a predetermined position, it is possible to control the mounting position of the protruding part 210. As a result, it is possible to obtain a bump structure 300 whose mounting position has been strictly controlled.

Figure 11:
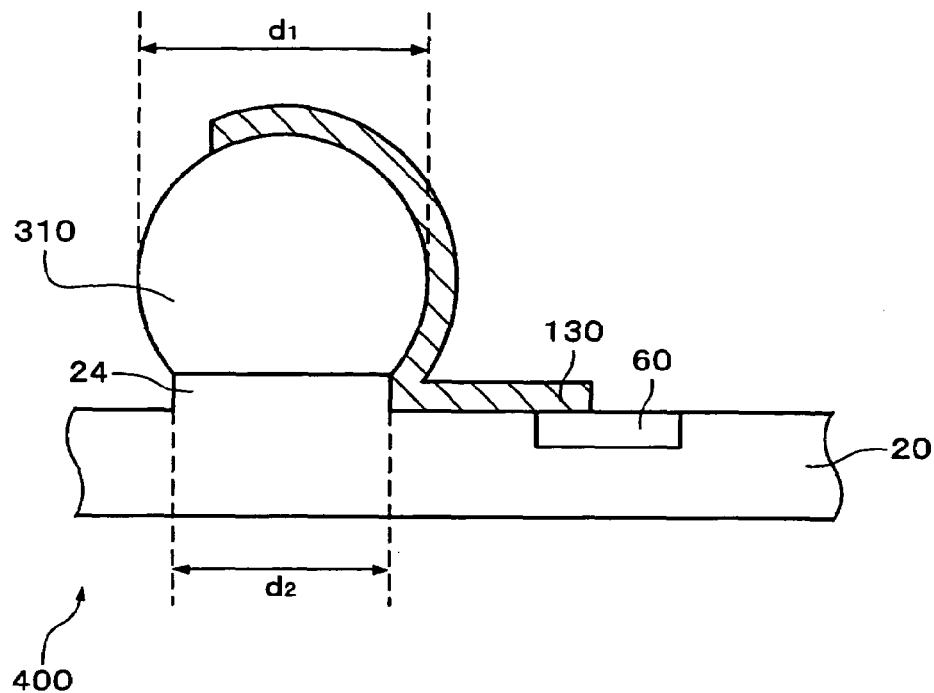
FIG. 11 is a cross-sectional view that schematically shows a bump structure according to the fourth embodiment.
Figure 12:
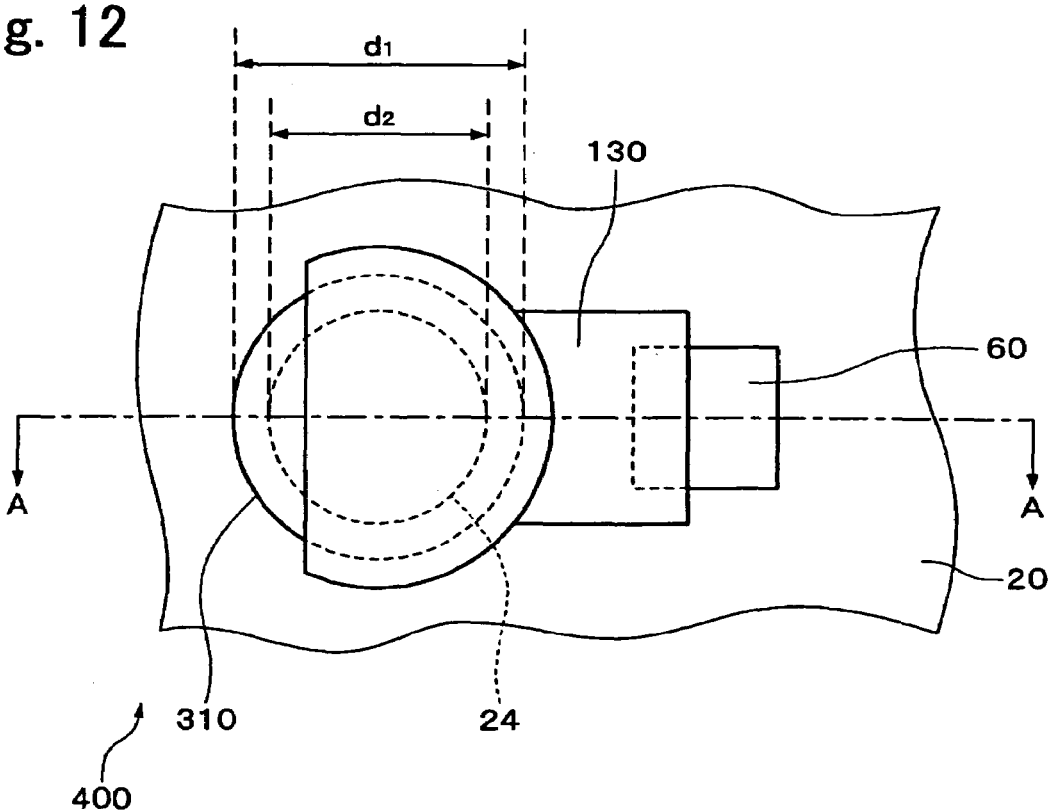
FIG. 12 is a plan view schematically showing the bump structure shown in FIG. 11.

FIG. 11 is a cross-sectional view schematically showing a bump structure 400 according to another embodiment of the present invention. FIG. 12 is a plan view schematically showing the bump structure 400 shown in FIG. 11. It should be noted that FIG. 11 shows a cross-section taken along a line A—A in FIG. 12.

The construction of the bump structure 400 according to the embodiment differs to that of the bump structure 300 (see FIG. 8 and FIG. 9) of the third embodiment in that a maximum width $d_1$ of a cross-section of the protruding part 310 is larger than a maximum width $d_2$ of the upper surface 24a of the protrusion 24 and in that a conductive layer 130 is electrically connected to an electrode connecting part 60. In other words, in the bump structure according to the third embodiment, the case in which the maximum width (maximum diameter) $d_1$ of the cross-section of the protruding part 210 is equal to the maximum width (diameter) $d_2$ of the upper surface 24a of the protrusion 24 is shown.

The other component elements have the same constructions as in the bump structure 300 according to the third embodiment. Accordingly, in the bump structure 400 according to the present embodiment, component elements that are the same as in the bump structure 300 have been assigned the same reference numerals as the component elements of the third embodiment and detailed description thereof has been omitted.

Figure 13:
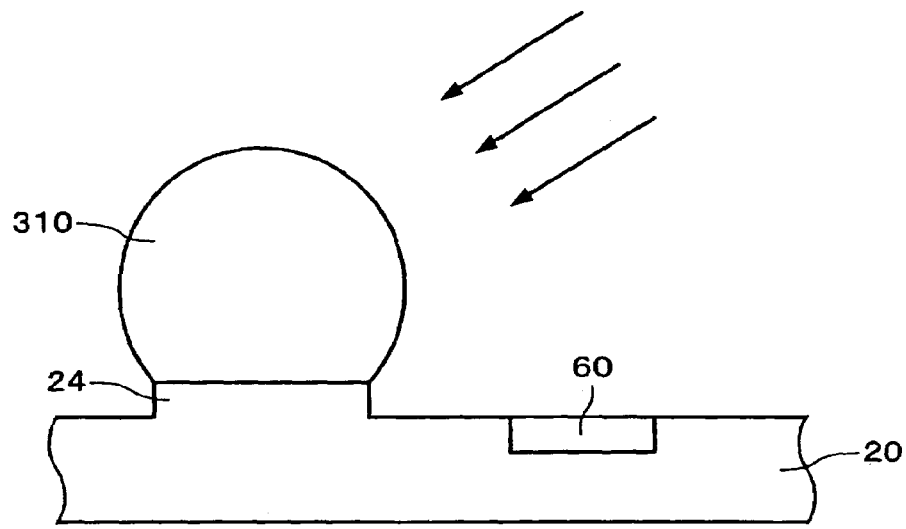
FIG. 13 is a cross-sectional view schematically showing a manufacturing process for the bump structure shown in FIG. 11 and FIG. 12.

In the bump structure 400 of the embodiment, the conductive layer 130 is composed of the material given as an example of the material of the conductive layer 30 of the first embodiment. The conductive layer 130 can be formed by forming a conductive layer (not shown) on a protruding part 410 and the insulating layer 20 by anisotropic sputtering from a direction shown by an arrow in FIG. 13 and then patterning the conductive layer in a predetermined shape.

Also, in this bump structure 400, the conductive layer 130 is electrically connected to the electrode connecting part 60. The electrode connecting part 60 is an electrode of the element (for example, a semiconductor element). More specifically, as shown in FIG. 11 and FIG. 12, the conductive layer 130 extends over the electrode connecting part 60. It should be noted that the other embodiments are the same as the bump structure 400 according to the present embodiment in that it is possible to electrically connect the conductive layer 30 to the electrode connecting part.

The bump structure 400 according to the embodiment has the same operation and effects as the bump structure 300 according to the third embodiment.

In addition, with the bump structure 400 according to the present embodiment, the maximum width (maximum diameter) $d_1$ of the cross section of the protruding part 310 is larger than the maximum width (diameter) $d_2$ of the upper surface 24a of the protrusion 24. This means that when two substrates (for example, an IC chip and a circuit board) are mounted on one another via the bump structure 400, the distance between the two substrates can be increased. By doing so, in the case where an underfill material or the like is introduced between the substrates after mounting, it becomes easy to introduce the underfill material between the substrates.

Figure 14:
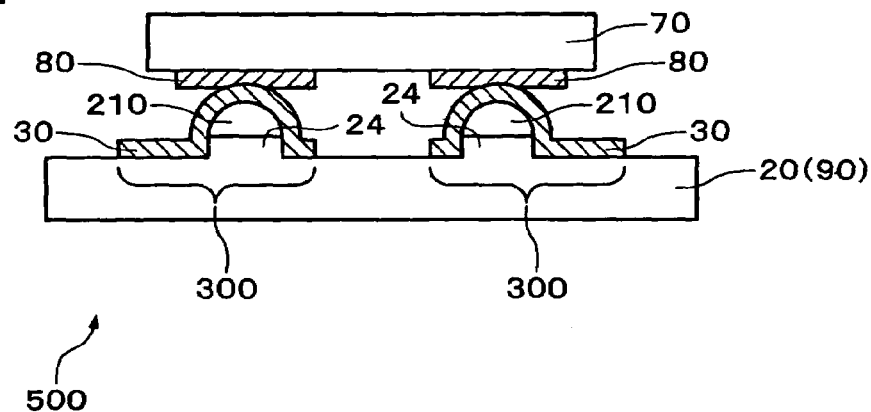
FIG. 14 is a cross-sectional view that schematically shows a mounting structure using bump structures according to the fifth embodiment.
Figure 15:
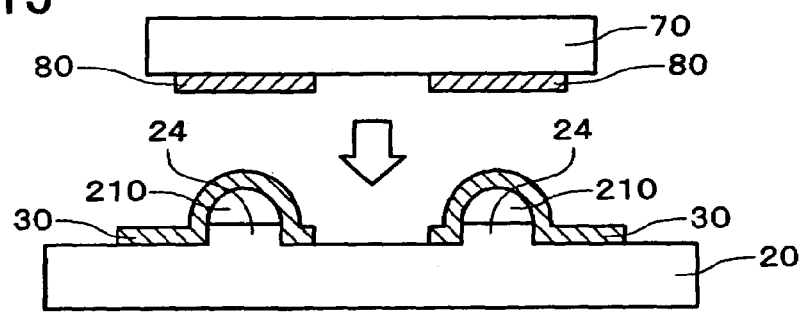
FIG. 15 is a cross-sectional view that schematically shows a manufacturing process of the mounting structure shown in FIG. 14.

FIG. 14 is a cross-sectional view schematically showing a mounting structure 500 according to another embodiment of the invention. FIG. 15 is a cross-sectional view schematically showing a method of manufacturing the mounting structure 500 shown in FIG. 14.

The mounting structure 500 according to the invention is composed of a circuit board 90 and an IC chip 70. The circuit board 90 and the IC chip 70 are electrically connected via bump structures 300 according to the third embodiment.

It should be noted that in the mounting structure 500, the bump structures 300 are formed on the circuit board 90, but it is also possible for the bump structures 300 to be formed on the IC chip 70 instead. Also, in the mounting structure 500, it is possible to provide the bump structures according to the first, second, or fourth embodiments in place of the bump structures 300.

In the present embodiment, although the case where the circuit board 90 is composed of the insulating layer 20 is shown, the material of the circuit board 90 is not limited to an insulating layer. When the circuit board 90 is composed of an insulating layer, the circuit board 90 may be composed of a glass substrate or a glass-epoxy substrate, for example. In addition, a wiring layer (here the conductive layer 30) is formed on the surface of the circuit board 90. As examples, this circuit board 90 may be a circuit board whose surface is protected by an insulator such as a resist or polyimide, or may be a flexible board such as a polyimide tape board.

Also, at least a semiconductor element is mounted on the IC chip 70. Also, for example, it is possible to mount light elements, such as light-emitting elements and light-receiving elements, onto the IC chip 70. It should be noted that the semiconductor elements have been omitted from FIG. 14 and FIG. 15.

As shown in FIG. 15, the mounting structure 500 can be formed by joining the circuit board 90 and the IC chip 70 via the bump structures 300.

The invention is not limited to the above embodiments and can be modified in a variety of ways. For example, the invention includes constructions that are effectively the same (for example, constructions that have the same functions, methods, and results or constructions that have the same objects and results) as the constructions that have been described in the embodiments. Also, the invention includes constructions in which non-essential parts of the constructions described in the above embodiments have been replaced. The invention includes constructions that have the same operation and effects, or constructions that can achieve the same object, as the constructions described in the above embodiments. Also, the invention includes constructions where known technologies have been added to the constructions described in the embodiments.

Further, while this invention has been described in conjunction with specific embodiments thereof, it is evident that many alternatives, modifications, and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. A method of manufacturing a bump structure, comprising:
    forming a liquid-repelling part with a liquid-repelling characteristic for droplets and a liquid-attracting part that is more wettable than the liquid-repelling part for the droplets on an upper surface of an insulating layer, the droplets including a precursor of UV-hardening resin, forming the liquid-repelling part including using a plasma treatment;
    discharging the droplets onto the liquid-attracting part to form a protruding part precursor;
    hardening the protruding part precursor by applying UV rays to form a protruding part;
    forming the protruding part directly on the insulating layer; and
    forming a conductive layer so as to cover the protruding part,
    discharging the droplets comprising discharging the droplets directly on the insulating layer without a conductor between the droplets and the insulating layer.

2. The method of manufacturing a bump structure according to claim 1, before the protruding part precursor is formed, a liquid repelling treatment being carried out on a region adjacent to a region in which the protruding part precursor is formed.

3. The method of manufacturing a bump structure according to claim 1, the droplets being discharged using an ink jet method.

4. The method of manufacturing a bump structure according to claim 1, forming the conductive layer comprising sandwiching the protruding part between the conductive layer and the insulating layer on which the droplets are discharged.

* * * * *